United States Patent [19]

Umeno et al.

[11] Patent Number: 4,789,421
[45] Date of Patent: Dec. 6, 1988

[54] GALLIUM ARSENIDE SUPERLATTICE CRYSTAL GROWN ON SILICON SUBSTRATE AND METHOD OF GROWING SUCH CRYSTAL

[75] Inventors: Masayoshi Umeno; Shiro Sakai, both of Nagoya; Tetsuo Soga, Nakatsugawa, all of Japan

[73] Assignee: Daidotokushuko Kabushikikaisha, Japan

[21] Appl. No.: 780,910

[22] Filed: Sep. 27, 1985

[30] Foreign Application Priority Data

Oct. 9, 1984 [JP] Japan .................................. 59-213188

[51] Int. Cl.[4] .............................................. C30B 29/40
[52] U.S. Cl. .................................... 156/610; 148/33.4; 148/DIG. 149; 156/612; 156/61.3; 156/DIG. 81; 427/255; 427/255.2; 428/446
[58] Field of Search ........ 156/610, 612, 613 DIG. 81; 423/601; 148/DIG. 149, 33.4; 428/446; 427/255, 255.2

[56] References Cited

U.S. PATENT DOCUMENTS

| | | | |
|---|---|---|---|
| 4,066,481 | 1/1978 | Manasevit et al. | 156/610 |
| 4,088,515 | 5/1978 | Blakeslee et al. | 156/610 |
| 4,517,047 | 5/1985 | Chang et al. | 156/610 |
| 4,561,916 | 12/1985 | Akiyama et al. | 156/612 |
| 4,578,127 | 3/1986 | Gossard et al. | 156/612 |
| 4,588,451 | 5/1986 | Vernon | 156/612 |

OTHER PUBLICATIONS

Fabrication of GaAs MesFet Ring Oscillator on MOCVD Grown GaAs/Si (100) Substrate, Nonaka et al. 11/24/84.

*Primary Examiner*—John Doll
*Assistant Examiner*—Lori S. Freeman
*Attorney, Agent, or Firm*—Berman, Aisenberg & Platt

[57] ABSTRACT

A GaAs growth crystal comprises a Si substrate, an intermediate layer formed on the substrate and a GaAs layer grown on the intermediate layer. The intermediate layer includes constituent GaP/GaAsP and GaAsP/GaAs superlattice layers and additionally AlP and AlGaP thin films.

11 Claims, 2 Drawing Sheets

GALLIUM ARSENIDE SUPERLATTICE CRYSTAL GROWN ON SILICON SUBSTRATE AND METHOD OF GROWING SUCH CRYSTAL

BACKGROUND OF THE INVENTION

1. Field of the Invention

This invention relates to gallium arsenide (GaAs) growth crystals formed on silicon (Si) substrate which are necessary for producing such semiconductors as are employed, for example, in solar cells, microwave-communication devices and the like and to a method of growing such crystals.

2. Description of the Prior Art

As a semiconductor employed in the above mentioned devices, a conventional crystal is known which consists of a GaAs layer grown on a GaAs substrate [for example, Journal of Crystal Growth, 55 (1981) 213–222, North-Holland Publishing Company]. Such a semiconductor, however, is not practical since it costs too much to produce.

The inventors tried to make use of a Si substrate. When a GaAs single crystal is grown on a Si substrate, according to the inventors' experience, an intermediate layer of germanium (Ge) must first be formed on the Si substrate, for example, by evaporation as a kind of moderator material to absorb the mismatching effects originating from the differences between the lattice constants and between the coefficients of thermal expansion of Si and GaAs. The GaAs growth crystal on the Si substrate is then obtained by growing a GaAs layer on the intermediate layer.

The provision of the GaAs layer onto Si substrate by this method, however, requires such special technical steps other than the metalorganic chemical vapor deposition (MOCVD) process, as the ion cluster beam or vacuum evaporation technique. These additional steps unduly increase the cost of production of the growth crystal, and the performance of produced growth crystals widely diverges, owing to the variable crystalline properties governed notably by the structural condition of the formed Ge layer. It is a further shortcoming that the photoluminescence (PL) intensity of the GaAs layer provided on the Ge layer is smaller by one order of magnitude than that of the uppermost layer of a GaAs crystal grown, for example, on a GaAs substrate.

SUMMARY OF THE INVENTION

It is therefore a first object of the present invention to provide a GaAs growth crystal on a Si substrate which can be produced by the MOCVD process alone.

It is a second object of the present invention to provide a GaAs growth crystal on a Si substrate which is inexpensive, superior in crystalline properties and efficiently photoluminescent.

It is a third object of the present invention to provide a method of growing the above mentioned GaAs crystal.

According to the present invention, an intermediate layer which has constituent superlattice layers intended to absorb the lattice mismatching between Si and GaAs is first formed on a Si substrate, and a GaAs layer is grown on the intermediate layer.

Other objects and advantages of the invention will become apparent during the following discussion of the accompanying drawings.

DESCRIPTION OF THE PREFERRED EMBODIMENTS

Figure 1:
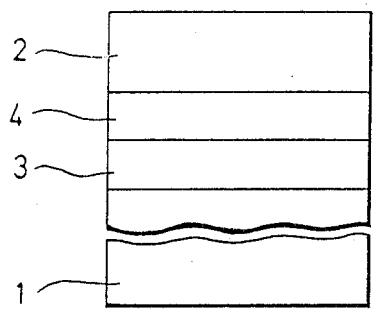
FIG. 1 is a view in section showing the construction of different layers of a growth crystal as a first embodiment of the present invention.

Referring to FIG. 1, a first embodiment of the present invention is explained. FIG. 1 shows an example of a growth crystal including a GaAs layer 2 grown over a Si substrate 1 by means of a MOCVD system. On the Si substrate 1 are first grown 10 superlattice layers 3, each of which consists of gallium phosphide (GaP) with a lattice constant nearly equal to that of Si and of gallium arsenide-phosphide (GaAsP) with a lattice constant different from that of GaP and is about 200 Å in thickness. On the GaP/GaAsP superlattice layers 3 are then grown 10 superlattice layers 4, each of which consists of GaAsP and GaAs and is about 200 Å in thickness. The superlattice layers 3 and 4 thus grown form an intermediate layer to absorb the lattice mismatching between Si and GaAs. The GaAs layer 2 (about 2 $\mu$m in thickness) is finally grown onto GaAsP/GaAs superlattice layers 4. The employed substrate 1 is made of n-type (100) silicon, and trimethylgallium [Ga(CH$_3$)$_3$], trimethylaluminum [Al(CH$_3$)$_3$], arsine (AsH$_3$) and phosphine (PH$_3$) are used as the source materials of elements constituting the growth crystal. The GaAs layer 2 (with a smooth top surface) can be grown on the Si substrate 1 in a single growth process without any pre-cracking treatment for the V column elements by employing a horizontal atmospheric-pressure induction-heating furnace as a reactor.

The more detailed process of the crystal growth in the above mentioned embodiment is as follows. The Si substrate 1 is first heated at 1,000° C. in a hydrogen atmosphere about for 10 minutes in order to remove silicon dioxide (SiO$_2$) deposited on the Si substrate 1. Thereafter, 10 GaP/GaAsP superlattice layers 3 are grown at a growth temperature of 830° C., and the growth of 10 GaAsP/GaAs superlattice layers 4 follows. The GaAs layer 2 (about 2 $\mu$m in thickness) is subsequently grown at 730° C. on the superlattice layers 4. The GaP superlattice constituent is grown from Ga(CH$_3$)$_3$ and PH$_3$, the GaAsP superlattice constituent is grown from Ga(CH$_3$)$_3$, AsH$_3$ and PH$_3$, and the GaAs layer is grown from Ga(CH$_3$)$_3$ and AsH$_3$, all the source materials being supplied into the reactor.

An experiment was carried out to measure the PL intensity from the uppermost surface of the growth crystal provided by the aforementioned process, in which the intermediate layer (consisting of the GaP/GaAsP superlattice layers 3 and GaAsP/GaAs superlattice layers 4) is grown on the Si substrate 1 as moderator material to absorb the lattice mismatching between the GaAs layer 2 and the Si substrate 1. It has been experimentally confirmed that the PL intensity of the growth crystal according to the present embodiment is larger by one order of magnitude than that from the uppermost surface of a conventional growth crystal (as referred to in the prior art) in which a Ge intermediate layer is grown between a lower Si substrate and an upper GaAs layer.

Figure 2:
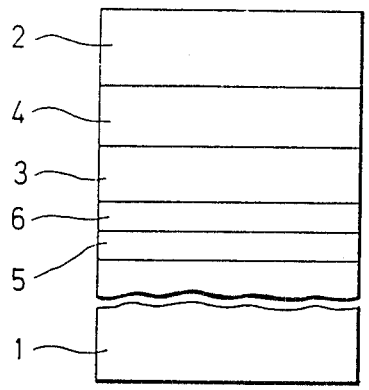
FIG. 2 is a view similar to FIG. 1 of a growth crystal as a second embodiment of the present invention.

FIG. 2 is concerned with another process of growing the GaAs layer 2 over the Si substrate 1 made of n-type (100) Si by means of the MOCVD reactor system in a manner similar to the first embodiment. On the Si substrate 1 is first formed a phosphide aluminum (AlP) thin film 5 which is capable of firmly joining to and therefore easily grown on the Si substrate 1 and is 100 Å in thickness, and a gallium-aluminum phosphide (AlGaP) thin film 6 (100 Å in thickness) is formed on the film 5. Thereafter, 10 GaP/GaAsP superlattice layers 3, each being 200 Å in thickness, and 10 GaAsP/GaAs superlattice layers 4, each being 200 Å in thickness, are grown in the same manner as in the first embodiment. The thin films 5 and 6 and the superlattice layers 3 and 4 form an intermediate layer to absorb the lattice mismatching between the Si substrate 1 and the GaAs layer 2, which is lastly grown on the intermediate layer. The reactor and the source materials for growing the intermediate layer and the uppermost GaAs layer 2 are the same as those employed in the first embodiment. The AlP thin film 5 in the intermediate layer is grown from $Al(CH_3)_3$ and $PH_3$, and the AlGaP thin film 6 is grown from $Al(CH_3)_3$, $Ga(CH_3)_3$ and $PH_3$, all the source materials being similarly supplied into the reactor. The superlattice layers 3 and 4 and the uppermost GaAs layer 2 are grown in the same manner as in the first embodiment.

An improvement is experimentally confirmed in the surface homology of the GaAs crystal layer of the growth crystal provided by the present process in which the AlP thin film 5, the AlGaP thin film 6, the GaP/GaAsP superlattice layers 3, the GaAsP/GaAs superlattice layers 4, these four forming the intermediate layer to absorb the aforementioned lattice mismatching and the GaAs layer 2 are successively grown in this order on or over the Si substrate 1. In addition, it has been confirmed by experiments that this growth crystal has a PL intensity not less than that of the growth crystal of the first embodiment.

Figure 3:
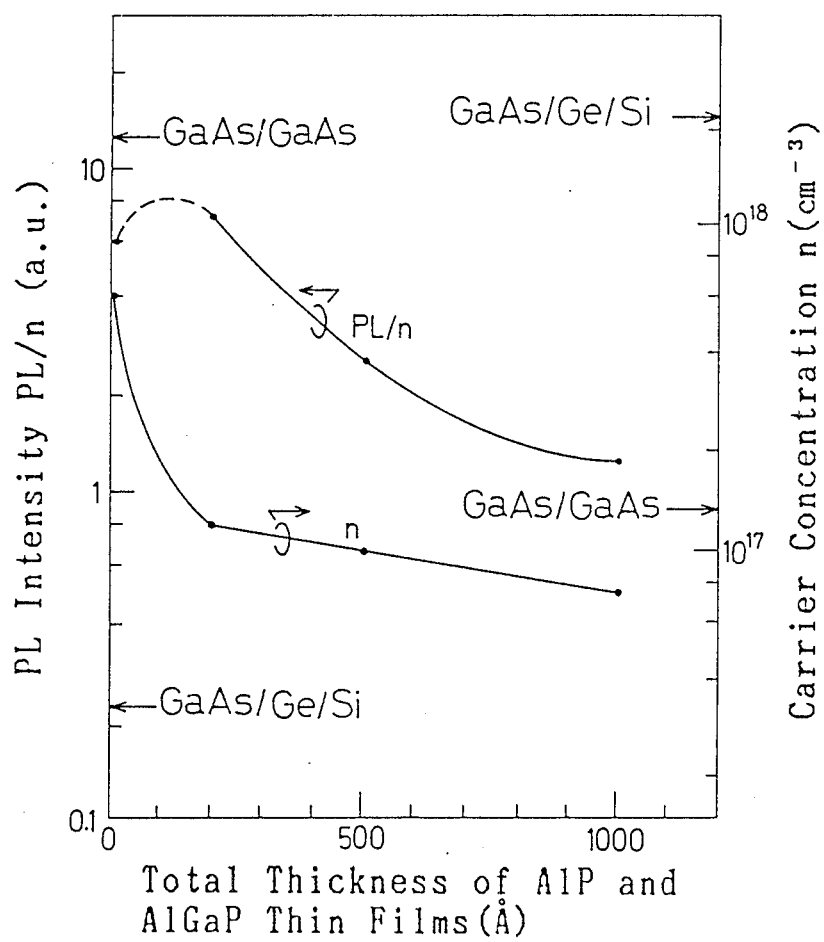
FIG. 3 is a graph exhibiting the dependence of the measured PL intensity and carrier concentration of the growth crystal of FIG. 2 on the total thickness of AlP and AlGaP thin films.

As a result of some experiments, it has become apparent that the total thickness of the AlP film 5 and the AlGaP thin film 6 is interrelated with the PL intensity and the carrier concentration in the uppermost GaAs layer 2. According to the experiments, the PL intensity of the present growth crystal is maximum around 100 Å of the total thickness of the AlP thin film 5 and the AlGaP thin film 6, and the carrier concentration is increased by reducing the total thickness, rising acutely with the vanishing total thickness. These experimental results are exhibited in FIG. 3 where n represents the carrier number per $cm^3$ in the GaAs layer 2, i.e., the carrier concentration, and PL/n represents PL intensity per carrier concentration.

Figure 4:
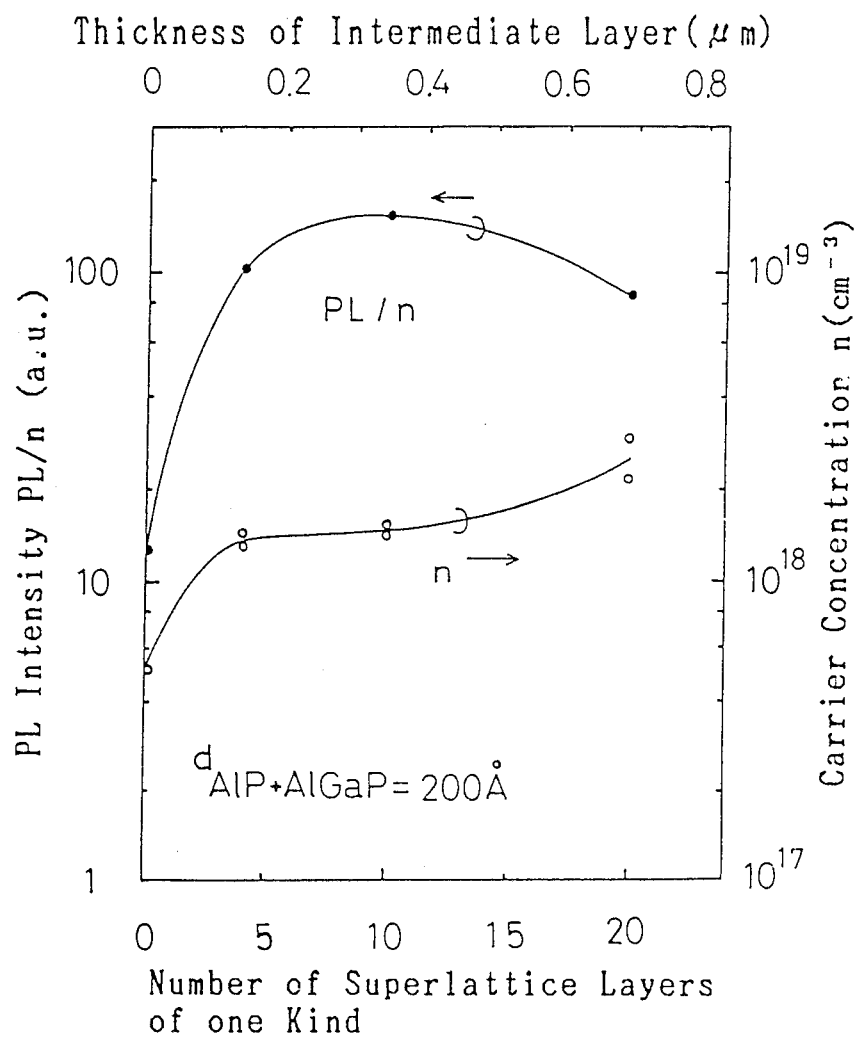
FIG. 4 is a graph exhibiting the dependence of the measured PL intensity and carrier density of the growth crystal of FIG. 3 on the number of superlattice layers of one kind.

It has also been found experimentally that the number of superlattice layers of each kind or the thickness of the intermediate layer of the second embodiment is interrelated with PL/n and n. PL/n is maximum at about 10 superlattice layers, and n increases monotonically with the increasing number of superlattice layers as shown in FIG. 4.

Table 1 lists the full-width at half maximum (meV) of the growth crystal in the first embodiment, i.e., GaAs/(GaAsP/GaAs)/(GaP/GaAsP)/Si substrate, of that in the second embodiment, i.e., GaAs/(GaAsP/GaAs)/(GaP/GaAsP)/AlGaP/AlP/Si substrate, and of that according to the prior art, i.e., GaAs/Ge/Si substrate at 150° K.

TABLE 1

| growth crystal | full-width at half maximum (meV) |
| --- | --- |
| GaAs/(GaAsP/GaAs)/(GaP/GaAsP)Si substrate | 52 |
| GaAs/(GaAsP/GaAs)/(GaP/GaAsP)/AlGaP/AlP/Si substrate | 41 |
| GaAs/Ge/Si substrate | 62 |

Since the crystalline properties of the growth crystal is improved as the PL full-width at half maximum (meV) decreases, it is seen from Table 1 that the crystalline properties either of the growth crystal GaAs/(GaAsP/GaAs)/(GaP/GaAsP)/Si substrate of the first embodiment or the growth crystal GaAs/(GaAsP/GaAs)/(GaP/GaAsP)/AlGaP/AlP/Si substrate of the second embodiment are superior to those of the usual growth crystal GaAs/Ge/Si substrate. The crystalline properties are especially improved by introducing the AlP thin film 5 and the AlGaP thin film 6 into the intermediate layer.

The above mentioned process of growing the GaAs layer 2 over the Si substrate 1 via the intermediate layer, including constituent superlattice layers, can provide growth crystals having a PL intensity higher than that of conventional growth crystal in which the Ge intermediate layer is inserted. The process also makes it possible to produce cheaply a growth crystal having a PL intensity equal to that of such GaAs crystal grown on a GaAs substrate that was heretofore considered to be impractical because of its high production cost.

With use of the growth crystals according to the present invention, inexpensive and extremely efficient solar cells can be manufactured, and light emitting devices which can not be made of Si, an indirect gap semiconductor, can easily be formed on Si substrates. It is therefore possible to produce novel devices in which the light emitting devices are combined integrally with various electronic components made of Si. It is moreover possible to prepare high-speed or microwave-communication devices in the form of monolithic semiconductor elements including various integral circuits, the freedom of manufacturing electronic devices being thereby largely extended.

In conclusion, the present invention is useful for providing an inexpensive efficiently photoluminescent growth crystal (superior in crystalline properties) by means of the process in which the intermediate layer having constituent superlattice layers is formed between the Si substrate and the GaAs layer in order to absorb the lattice mismatching between them.

As many apparently widely different embodiments of the present invention may be made without departing from the spirit and scope thereof, it is to be understood that the invention is not limited to the specific embodiments thereof except as defined in the appended claims.

What is claimed is:

1. A superlattice crystal comprising a Si substrate layer, a GaAs layer and intermediate layer to absorb lattice mismatching between the Si substrate layer and the GaAs layer, the intermediate layer means comprising at least two differently-constituted superlattices, the constituent super lattice layers being those of sequentially-disposed and differently constituted superlattices which in combination absorb said lattice mismatching.

2. A superlattice crystal as set forth in claim 1 wherein said intermediate layer includes a GaP/GaAsP superlattice on said Si substrate and a GaAsP/GaAs superlattice on said GaP/GaAsP superlattice.

3. A superlattice crystal as set forth in claim 1 wherein said intermediate layer includes an AlP thin film on said Si substrate, an AlGaP thin film on said AlP film, a GaP/GaAsP superlattice on said AlGaP film and GaAsP/GaAs superlattice on said GaP/GaAsP superlattice.

4. A superlattice crystal as set forth in claim 1 wherein the intermediate layer includes a GaP/GaAsP superlattice and a GaAsP/GaAs superlattice, the latter being in direct contact with the GaAs layer.

5. A superlattice crystal as set forth in claim 1 wherein the intermediate layer comprises, sequentially:
   (a) an AlP thin film in direct contact with the Si substrate layer,
   (b) an AlGaP thin film in direct contact with the AlP thin film,
   (c) a GaP/GaAsP superlattice in direct contact with the AlGaP thin film, and
   (d) an arbitrary number of GaAsP/GaAs superlattice layers, one of which is in direct contact with the GaAs layer.

6. A superlattice crystal as set forth in claim 1, wherein said intermediate layer means consists of a first superlattice having an average lattice constant larger than the lattice constant of said Si substrate and a second superlattice having an average lattice constant larger than that of said first superlattice and smaller than the lattice constant of said GaAs layer.

7. A superlattice crystal as set forth in claim 6 wherein said first superlattice is a GaP/GaAsP superlattice and said second superlattice is a GaAsP/GaAs superlattice.

8. A superlattice crystal as set forth in claim 1 wherein said intermediate layer means consist of a first thin film having a lattice constant equal to or larger than that of said Si substrate, a second thin film having a lattice constant equal to or larger than that of said first thin film, a first superlattice having an average lattice constant larger than the lattice constant of said second thin film and a second superlattice having an average lattice constant larger than that of said first superlattice and smaller than the lattice constant of said GaAs layer.

9. A superlattice crystal as set forth in claim 8 wherein said first thin film is an AlP thin film and said second thin film is an AlGaP thin film.

10. A superlattice crystal as set forth in claim 8 wherein said first superlattice is a GaP/GaAsP superlattice and said second superlattice is a GaAsP/GaAs superlattice.

11. A superlattice crystal as set forth in claim 8 wherein said first thin film is an AlP thin film, said second thin film is an AlGaP thin film, said first superlattice is a GaP/GaAsP superlattice and said second superlattice is a GaAsP/GaAs superlattice.

* * * * *

UNITED STATES PATENT AND TRADEMARK OFFICE
CERTIFICATE OF CORRECTION

PATENT NO. : 4,789,421
DATED : December 6, 1988
INVENTOR(S) : Masayoshi UMENO, Shiro SAKAI and Tetsuo SOGA It is certified that error appears in the above-identified patent and that said Letters Patent is hereby corrected as shown below:

On the title page of the patent, left column, item [73] should read --Assignee: Daidotokushuko Kabushikikaisha and Masayoshi Umeno, Japan--.

Signed and Sealed this

Sixth Day of June, 1989

Attest:

DONALD J. QUIGG

Attesting Officer

Commissioner of Patents and Trademarks